US009292255B2

(12) United States Patent
Azadet et al.

(10) Patent No.: US 9,292,255 B2
(45) Date of Patent: Mar. 22, 2016

(54) MULTI-STAGE CREST FACTOR REDUCTION (CFR) FOR MULTI-CHANNEL MULTI-STANDARD RADIO

(71) Applicant: Intel Corporation, Santa Clara, CA (US)

(72) Inventors: Kameran Azadet, Pasadena, CA (US); Albert Molina, Novelda (ES)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 13/661,351

(22) Filed: Oct. 26, 2012

(65) Prior Publication Data

US 2013/0114761 A1   May 9, 2013

Related U.S. Application Data

(60) Provisional application No. 61/552,242, filed on Oct. 27, 2011.

(51) Int. Cl.
| | |
|---|---|
| *H04K 1/02* | (2006.01) |
| *H04L 25/03* | (2006.01) |
| *H04L 25/49* | (2006.01) |
| *G06F 5/01* | (2006.01) |
| *H04B 1/04* | (2006.01) |
| *H04L 1/00* | (2006.01) |
| *H04L 27/233* | (2006.01) |

(Continued)

(52) U.S. Cl.
CPC ............... *G06F 5/01* (2013.01); *G06F 9/3001* (2013.01); *H03F 1/0288* (2013.01); *H03F 1/3241* (2013.01); *H03F 1/3258* (2013.01); *H03F 3/189* (2013.01); *H03F 3/24* (2013.01); *H03M 3/30* (2013.01); *H04B 1/0475* (2013.01); *H04B 1/62* (2013.01); *H04L 1/0054* (2013.01); *H04L 25/02* (2013.01); *H04L 25/03178* (2013.01); *H04L 25/03216* (2013.01); *H04L 27/2334* (2013.01); *H03F 2200/336* (2013.01); *H03F 2201/3209* (2013.01); *H03F 2201/3212* (2013.01); *H03F 2201/3224* (2013.01); *H03F 2201/3233* (2013.01); *H04B 1/0003* (2013.01)

(58) Field of Classification Search
CPC ............................. H04B 1/62; H04B 1/0475
USPC .................................................. 375/296, 297
See application file for complete search history.

(56) References Cited

U.S. PATENT DOCUMENTS

| 7,313,373 B1* | 12/2007 | Laskharian et al. ........ 455/127.1 |
| 2006/0198466 A1* | 9/2006 | Wright et al. ................. 375/296 |

(Continued)

*Primary Examiner* — Nader Bolourchi
(74) *Attorney, Agent, or Firm* — Schwegman Lundberg & Woessner, P.A.

(57) ABSTRACT

Multi-stage crest factor reduction (CFR) techniques are provided for multi-channel multi-standard radio (MSR). A multi-stage crest factor reduction method comprises applying one or more data samples associated with at least one channel of a first technology type to a first individual crest factor reduction block; applying one or more data samples associated with at least one channel of a second technology type to a second individual crest factor reduction block; aggregating outputs of the first and second individual crest factor reduction blocks to generate an aggregated output; and applying the aggregated output to a composite crest factor reduction block. The individual crest factor reduction blocks can be implemented using a sampling rate appropriate for the corresponding technology type. The composite crest factor reduction block operates at a higher sampling rate than the individual crest factor reduction blocks.

21 Claims, 4 Drawing Sheets

(51) Int. Cl.
*H04B 1/62* (2006.01)
*G06F 9/30* (2006.01)
*H04L 25/02* (2006.01)
*H03M 3/00* (2006.01)
*H03F 1/02* (2006.01)
*H03F 1/32* (2006.01)
*H03F 3/189* (2006.01)
*H03F 3/24* (2006.01)
*H04B 1/00* (2006.01)

(56) References Cited

U.S. PATENT DOCUMENTS

| | | | |
|---|---|---|---|
| 2008/0247487 A1* | 10/2008 | Cai et al. | 375/296 |
| 2009/0029664 A1* | 1/2009 | Batruni | 455/212 |
| 2010/0098139 A1* | 4/2010 | Braithwaite | 375/219 |
| 2010/0246714 A1* | 9/2010 | Yang et al. | 375/296 |
| 2011/0059710 A1* | 3/2011 | Cai et al. | 455/232.1 |
| 2012/0093209 A1* | 4/2012 | Schmidt et al. | 375/224 |
| 2012/0280840 A1* | 11/2012 | Kyeong et al. | 341/101 |
| 2013/0044794 A1* | 2/2013 | Wenzel et al. | 375/219 |

* cited by examiner

MULTI-STAGE CREST FACTOR REDUCTION (CFR) FOR MULTI-CHANNEL MULTI-STANDARD RADIO

CROSS-REFERENCE TO RELATED APPLICATIONS

The present application claims priority to U.S. Patent Provisional Application Ser. No. 61/552,242, filed Oct. 27, 2011, entitled "Software Digital Front End (SoftDFE) Signal Processing and Digital Radio," incorporated by reference herein.

The present application is related to International Patent Application Serial No. PCT/US12/62195, entitled "Block-Based Crest Factor Reduction (CFR);" and U.S. patent application Ser. No. 13/661,295, entitled "Crest Factor Reduction (CFR) Using Asymmetrical Pulses," each filed contemporaneously herewith and incorporated by reference herein.

FIELD OF THE INVENTION

The present invention is related to digital signal processing techniques and, more particularly, to techniques for Crest Factor Reduction.

BACKGROUND OF THE INVENTION

The crest factor or peak-to-average ratio (PAR) is a measurement of a waveform, calculated from the peak amplitude of the waveform divided by the RMS value of the waveform. In many wireless communication technologies, the communication signals often have a high peak-to-average ratio (PAR) that can impair the efficiency of the power amplifiers (PAs) employed in wireless base stations. A number of techniques have been proposed or suggested for reducing the PAR in order to improve the efficiency of the power amplifier to thereby allow a higher average power to be transmitted before saturation occurs.

Crest Factor Reduction (CFR) is a digital technique used to reduce the PAR of the transmitted wireless signal. Generally, Crest Factor Reduction techniques employ peak detection and then peak cancellation by subtracting a cancellation pulse from the detected peaks, to reduce the peak amplitude and thereby reduce the PAR. The cancellation pulse is pre-computed and has a frequency response that matches the signal/channel spectral response. Thus, by design, the clipping noise is confined inside the signal channel, and does not introduce any noise in adjacent channels or out of band.

In existing multi-standard radio (MSR) multi-channel systems, a base-station first performs channel filtering, up-conversion from a baseband signal, and channel combining in the digital domain. Thereafter, the resulting composite signal undergoes Crest Factor Reduction on the combined signal at a high sampling rate (with significant complexity). The various multiple channels in a given multi-channel system often employ different technologies (with different requirements), such as Global System for Mobile Communications (GSM), Wideband Code Division Multiple Access (WCDMA), Code Division Multiple Access (CDMA), Worldwide Interoperability for Microwave Access (WiMAX) and Long Term Evolution (LTE), each potentially having different latency requirements. For example, the narrow bandwidth of GSM requires long filters for pulse cancellation in the CFR which would penalize the LTE channels, for instance, in term of latency and complexity. Thus, the different technologies typically have different latency requirements.

Thus, a need exists for Crest Factor Reduction techniques that can perform Crest Factor Reduction for a plurality of channels employing different technologies with improved latency and reduced complexity.

SUMMARY OF THE INVENTION

Generally, multi-stage crest factor reduction (CFR) techniques are provided for multi-channel multi-standard radio (MSR). According to one aspect of the invention, a multi-stage crest factor reduction method comprises applying one or more data samples associated with at least one channel of a first technology type to a first individual crest factor reduction block; applying one or more data samples associated with at least one channel of a second technology type to a second individual crest factor reduction block; aggregating outputs of the first and second individual crest factor reduction blocks to generate an aggregated output; and applying the aggregated output to a composite crest factor reduction block.

The individual crest factor reduction blocks can be implemented using a sampling rate appropriate for the corresponding technology type. The composite crest factor reduction block operates at a higher sampling rate than the individual crest factor reduction blocks.

A more complete understanding of the present invention, as well as further features and advantages of the present invention, will be obtained by reference to the following detailed description and drawings.

DETAILED DESCRIPTION

Figure 1:
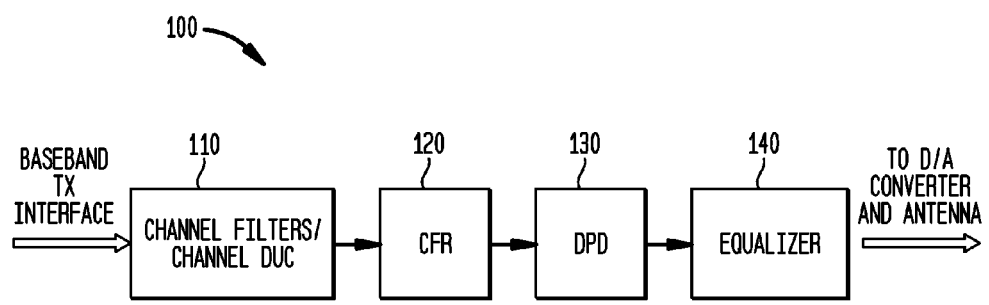
FIG. 1 illustrates portions of an exemplary transmitter in which aspects of the present invention may be employed.

FIG. 1 illustrates portions of an exemplary transmitter 100 in which aspects of the present invention may be employed. As shown in FIG. 1, the exemplary transmitter portion 100 comprises a channel filter and digital up conversion (DUC) stage 110, a crest factor reduction (CFR) stage 120, a digital pre-distortion (DPD) stage 130 and an optional equalization stage 140. Generally, the channel filter and digital up conversion stage 110 performs channel filtering using, for example finite impulse response (FIR) filters and digital up conversion to convert a digitized baseband signal to an intermediate frequency (IF). As indicated above, the crest factor reduction stage 120 limits the PAR of the transmitted signal. The digital pre-distortion stage 130 linearizes the power amplifier to improve efficiency. The equalization stage 140 employs RF channel equalization to mitigate channel impairments.

When the transmitter 100 is embodied as a multi-radio, multi-channel system, a base-station first performs channel filtering and digital up-conversion from a baseband signal, and channel combining in the channel filter and digital up conversion (DUC) stage 110. Thereafter, the resulting composite signal undergoes Crest Factor Reduction on the combined signal in the CFR stage 120 at a high sampling rate with significant complexity).

As previously indicated, the various multiple channels in a given multi-channel system often employ different technologies, such as Global System for Mobile Communications (GSM), Wideband Code Division Multiple Access (WCDMA), and Long Term Evolution (LTE), have different latency requirements. The different technologies typically have different latency requirements.

Thus, according to one aspect of the invention, Crest Factor Reduction is performed in multiple stages, where individual technology types of a multi-standard radio (MSR) (also known as multiple Radio Access Technologies (RATs)) undergo individual Crest Factor Reduction (at a sampling rate appropriate for the technology) prior to combining the individual technology types and then the combined composite signal is again processed by a combined Crest Factor Reduction at a higher sampling rate.

The present invention can be applied in handsets, base stations and other network elements.

Figure 2:
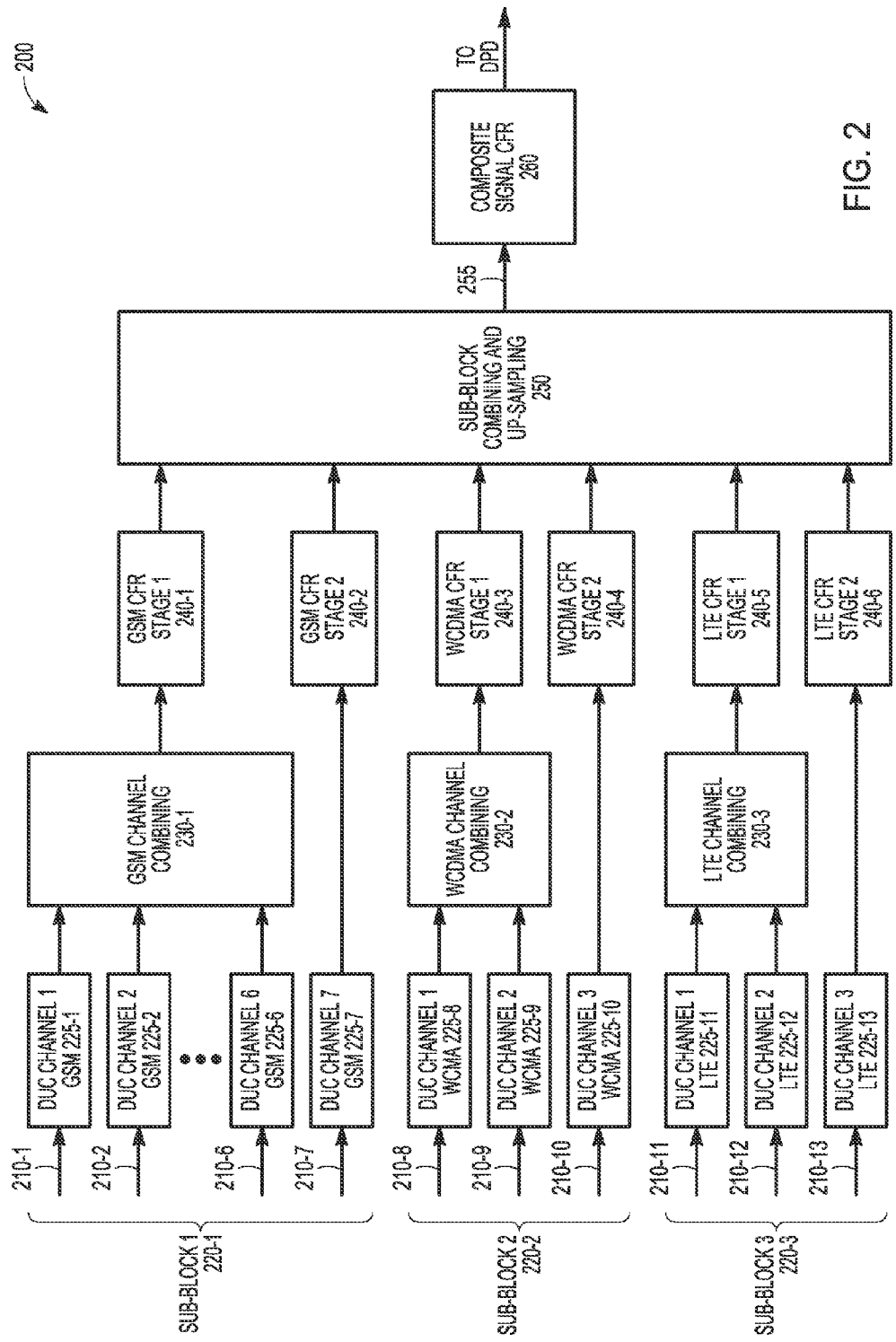
FIG. 2 illustrates a multi-stage Crest Factor Reduction system in accordance with an embodiment of the invention.

FIG. 2 illustrates a multi-radio multi-channel communication system 200 incorporating multi-stage Crest Factor Reduction in accordance with an embodiment of the invention. As shown in FIG. 2, the communication system 200 comprises a plurality of channels 210. The various multiple channels 210 in a given multi-channel system often employ different technologies, such as Global System for Mobile Communications (GSM), Wideband Code Division Multiple Access (WCDMA), and Long Term Evolution (LTE).

In the exemplary embodiment of FIG. 2, the various channels 210 of each technology type are grouped into sub-blocks. For example, sub-block 1 (220-1) is comprised of seven GSM channels 210-1 through 210-7. In addition, exemplary sub-block 2 (220-2) is comprised of three WCDMA channels 210-8 through 210-10. Exemplary, sub-block 3 (220-3) is comprised of three LIE channels 210-11 through 210-13.

The exemplary individual channels 210-$i$ (i equal 1-13) are each applied to a corresponding digital up-converter 225$i$ (i equal 1-13). Thereafter, at least some of the individual channels in each exemplary sub-block 220-1 through 220-3 (as shown channels 210-1 through 210-6, 210-8 through 210-9 and 210-11 through 210-12) are combined in a corresponding combiner 230-1 through 230-3.

Thereafter, the combined signal for each sub-block 220-1 through 220-3 is applied to a corresponding individual CFR stage 240-1, 240-3 and 240-5. In addition, as shown, each of GSM channel 210-7, WCDMA channel 210-10 and LTE channel 210-13 is applied to a corresponding individual CFR stage 240-2, 240-4 and 240-6. Each individual CFR stage 240-1 through 240-6 can be implemented using a sampling rate that is appropriate for the corresponding technology. As noted above, the narrow bandwidth of GSM requires longer filters (i.e., larger taps) for pulse cancellation in the CFR than the LTE channels. Thus, the individual CFR stage 240-1 for GSM channels have a lower sampling rate than the individual CFR stage 240-3 for LTE channels to optimize the latency for each individual technology type.

Thereafter, outputs of each individual CFR stage 240-1 through 240-6 associated with each sub-block 220-1 through 220-3 can be combined at stage 250 to generate a multi-carrier combined signal 255. The combined signal 255 is again processed by a combined Crest Factor Reduction stage 260 at a higher sampling rate.

The output of the combined Crest Factor Reduction stage 260 can then be applied to the digital pre-distortion stage 130 (FIG. 1).

It is noted that in a further embodiment, one or more of the individual channels 210 can have a dedicated stage 1 CFR 240. For example, an LTE channel has a large crest factor and may benefit from a dedicated stage 1 CFR 240, as shown, CFR 240-6. Thus, an individual CFR block, such as 240-6, may be used to process the GSM, WCDMA or LIE data samples of a particular channel.

Figure 3:
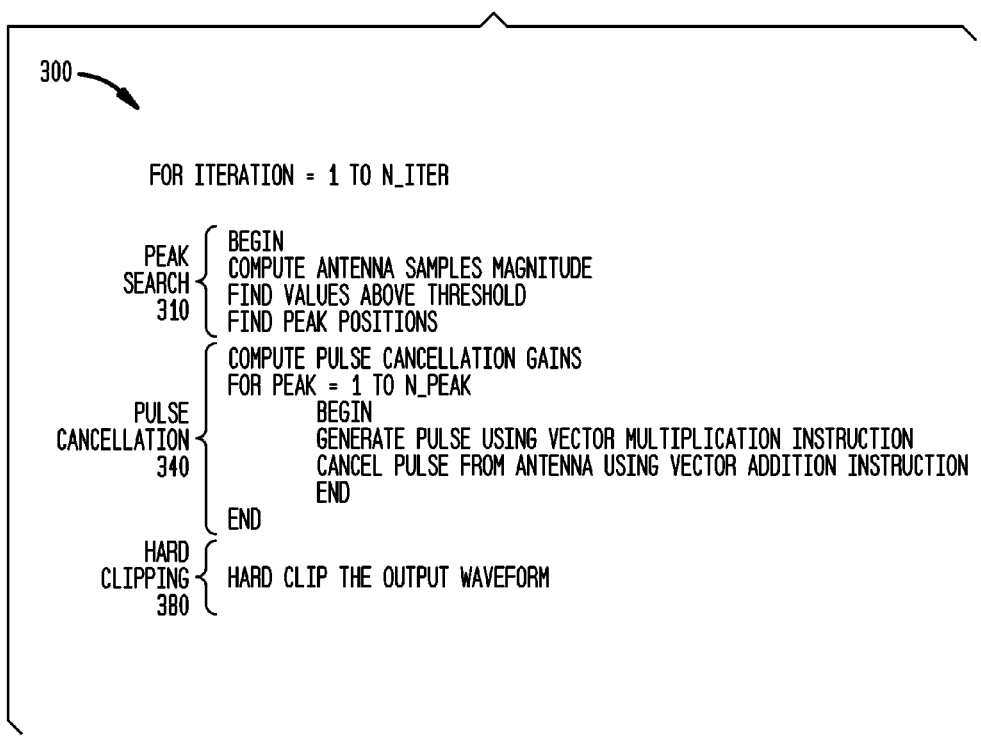
FIG. 3 illustrates exemplary pseudo code for a suitable Crest Factor Reduction algorithm.

FIG. 3 illustrates exemplary pseudo code for a suitable Crest Factor Reduction algorithm 300. It is noted that any alternative Crest Factor Reduction algorithm could also be employed. The exemplary Crest Factor Reduction algorithm 300 can be used to implement the individual Crest Factor Reduction (at lower sampling rate) at stage 240 prior to combining channels at stage 250 and then the combined composite signal is again processed by a combined Crest Factor Reduction at stage 260 at a higher sampling rate.

As shown in FIG. 3, the exemplary Crest Factor Reduction algorithm 300 comprises three parts, namely a peak search phase 310, a pulse cancellation phase 340 and a hard clipping phase 380. The exemplary Crest Factor Reduction algorithm 300 can be implemented in hardware or in software.

The exemplary Crest Factor Reduction algorithm 300 can optionally be performed iteratively to address peak regrowth. For example, a number of iterations, N_iter, can have a value between 1 and 4.

During, the peak search phase 310, a search is conducted through the signal to determine the number of peaks, their locations and the magnitudes above the threshold level. The exemplary Crest Factor Reduction algorithm 300 initially computes the antenna samples magnitude. The sample values above a threshold are then identified. For example, the threshold can be established based on the PAR target. Thereafter, the peak positions can be identified, for example, using a max( ) instruction.

During the pulse cancellation phase 340, the cancellation pulses are arranged at each of the peaks, then all the pulses are subtracted from the peaks. Cancellation pulses are discussed further below in conjunction with FIGS. 3 and 4. The exemplary Crest Factor Reduction algorithm 300 computes the pulse cancellation gains (e.g., threshold divided by the magnitude of the detected peaks). Thereafter, the exemplary Crest Factor Reduction algorithm 300 enters a loop to separately process each peak. For each peak, a pulse is generated, for example, using a vector multiplication instruction, and then the pulse is cancelled from the antenna, for example, using a vector addition instruction.

During the hard clipping phase 380, the exemplary Crest Factor Reduction algorithm 300 hard clips the output waveform, for example, using non-linear operations for modulus inverse. The clipping threshold level R is set based on the PAR target. The hard clipping may be performed, for example, using a polar clipping technique. Generally, polar clipping involves computing $|x|$ comparing $|x|$ to a threshold R and scaling by $R/|x|$. If $|x|$ is greater than R, x is replaced by R.

In a further variation, crest factor reduction can be performed in the frequency domain.

It is noted that the multi-stage CFR techniques described herein can be applied to sample-by-sample-based and/or block-based crest factor reduction. For a discussion of block-based crest factor reduction, see International Patent Application Serial No. PCT/US12/62195, entitled "Block-Based Crest Factor Reduction (CFR)," filed contemporaneously herewith and incorporated by reference herein.

Figure 4A:
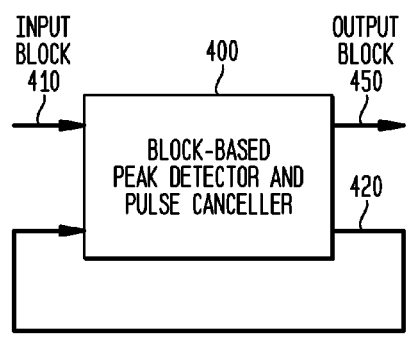
FIGS. 4A and 4B illustrate exemplary block-based and sample-based peak detector and pulse cancellers, respectively, for hardware implementations of Crest Factor Reduction.

FIG. 4A illustrates an exemplary block-based peak detector and pulse canceller 500 for a hardware implementation of multi-stage Crest Factor Reduction. The peak detector and pulse canceller 40 can be used for one or more iterations for a given input data block 410. As shown in FIG. 4A, an input data block 410 is applied to the peak detector and pulse canceller 400. The peak detector and pulse canceller 400 can optionally iterate with the processed block using a feedback path 420. After the final iteration a corresponding processed block of data 450 is output from the peak detector and pulse canceller 400.

Figure 4B:
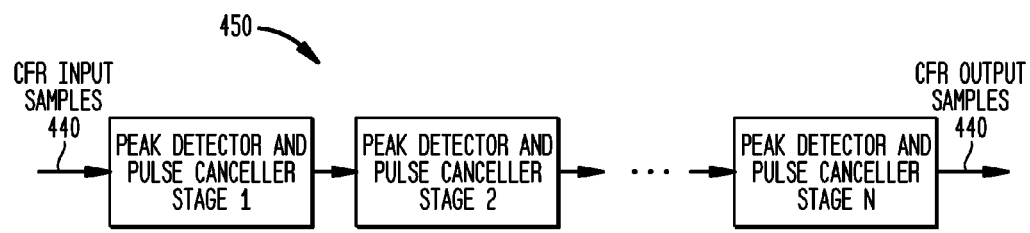

FIG. 4B illustrates an exemplary sample-based multi-stage peak detector and pulse canceller 450 for an alternate hardware implementation of Crest Factor Reduction. As shown in FIG. 4B, a plurality of input samples 440 are applied to the multi-stage peak detector and pulse canceller 450. The multi-stage peak detector and pulse canceller 450 is comprised of a plurality of CFR stages 1-N. The multi-stage peak detector and pulse canceller 450 generates a plurality of output samples 460.

The exemplary block-based peak detector and pulse canceller 400 of FIG. 4A or the exemplary sample-based peak detector and pulse canceller 450 of FIG. 4B can be used to implement the individual Crest Factor Reduction (at lower sampling rate) at stage 240 prior to combining channels at stage 250 and then the combined composite signal is again processed at stage 260 at a higher sampling rate.

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A multi-stage crest factor reduction method, comprising:
   applying one or more data samples associated with at least one channel of a first technology type to a first individual crest factor reduction (CFR) block in a first CFR stage, the one or more data samples associated with different channels of the at least one channel of the first technology type aggregated prior to being applied to the first individual CFR block;
   applying one or more data samples associated with at least one channel of a second technology type to a second individual CFR block in said first CFR stage, wherein the first technology type is different from the second technology type, the one or more data samples associated with different channels of the at least one channel of the second technology type aggregated prior to being applied to the second individual CFR block;
   applying one or more data samples associated with one of a channel of the first technology type or a channel of the second technology type directly to a third individual CFR block in said first CFR stage, wherein data samples associated with channels of the first technology type and data samples associated with channels of the second technology type are from signals communicated in accordance with different technology protocols;
   aggregating outputs of said first, second and third individual CFR blocks to generate an aggregated output of said first CFR stage; and
   applying said aggregated output of said first CFR stage to a composite crest factor reduction block in a second CFR stage.

2. The method of claim 1, wherein said first technology type comprises one or more of Global System for Mobile Communications (GSM), Wideband Code Division Multiple Access (WCDMA), Code Division Multiple Access (CDMA), Worldwide interoperability for Microwave Access (WiMAX) and Long Term Evolution (LTE), wherein said second technology type comprises one or more of Global System for Mobile Communications (GSM), Wideband Code Division Multiple Access (WCDMA), Code Division Multiple Access (CDMA), Worldwide Interoperability for Microwave Access (WiMAX) and Long Term Evolution (LTE) different from the first technology type.

3. The method of claim 1, wherein said first and second individual crest factor reduction blocks are implemented using a sampling rate appropriate for said corresponding technology type.

4. The method of claim 1, wherein said composite crest factor reduction block operates at a higher sampling rate than said first and second individual crest factor reduction blocks.

5. The method of claim 1, wherein said one or more data samples are processed sample-by-sample or as a block of data samples.

6. The method of claim 1, wherein the first technology type has a latency requirement different from the second technology type.

7. The method of claim 6, wherein a reduced latency results from performing:
   applying the one or more data samples associated with the at least one channel of the first technology type to the first individual crest factor reduction (CFR) block in the first CFR stage;
   applying the one or more data samples associated with the at least one channel of the second technology type to the second individual crest factor reduction block in said first CFR stage;
   aggregating the outputs of said first and second individual crest factor reduction blocks to generate the aggregated output of said first CFR stage; and
   applying said aggregated output of said first CFR stage to the composite crest factor reduction block in the second CFR stage.

8. The method of claim 1, wherein applying the one or more data samples associated with the at least one channel of the first technology type to the first individual CFR block in the first CFR stage comprises:
   applying one or more data samples associated with at least two channels of the first technology type to the first individual CFR block in the first CFR stage.

9. The method of claim 8, wherein applying the one or more data samples associated with the at least one channel of the second technology type to the second individual CFR block in said first CFR stage comprises:
applying one or more data samples associated with at least two channels of the second technology type to the second individual CFR block in said first CFR stage.

10. The method of claim 1, wherein the third individual CFR block is dedicated to the one of the channel of the first technology type or the channel of the second technology type, and the one of the channel of the first technology type or the channel of the second technology type has a large CFR.

11. A digital processor configured to perform multi-stage crest factor reduction, comprising:
a memory; and
at least one hardware device, coupled to the memory, operative to:
apply one or more data samples associated with at least one channel of a first technology type to a first individual crest factor reduction (CFR) algorithm in a first CFR stage, wherein the one or more data samples associated with different channels of the at least one channel of the first technology type are aggregated prior to being applied to the first individual CFR algorithm;
apply one or more data samples associated with at least one channel of a second technology type to a second individual CFR algorithm in said first CFR stage, wherein the first technology type is different form the second technology type and the one or more data samples associated with different channels of the at least one channel of the second technology type are aggregated prior to being applied to the second individual CFR algorithm;
apply one or more data samples associated with one of a channel of the first technology type or a channel of the second technology type directly to a third individual CFR algorithm block in said first CFR stage, wherein data samples associated with channels of the first technology type and data samples associated with channels of the second technology type are from signals communicated in accordance with different technology protocols;
aggregate outputs of said first, second and third individual CFR algorithms to generate an aggregated output of said first CFR stage; and
apply said aggregated output of said first CFR stage to a composite crest factor reduction algorithm in a second CFR stage.

12. The digital processor of claim 11, wherein said technology type comprises one or more of Global System fbr Mobile Communications (GSM), Wideband Code Division Multiple Access (WCDMA), Code Division Multiple Access (CDMA), Worldwide Interoperability for Microwave Access (WiMAX) and Long Term Evolution (LTE).

13. The digital processor of claim 11, wherein said first and second individual crest factor reduction algorithms are implemented using a sampling rate appropriate for said corresponding technology type.

14. The digital processor of claim 11, wherein said composite crest factor reduction algorithm operates at a higher sampling rate than said first and second individual crest factor reduction blocks.

15. The digital processor of claim 11, wherein said one or more data samples are processed sample-by-sample or as a block of data samples.

16. The digital processor of claim 12, wherein said second technology type comprises one or more of Global System for Mobile Communications (GSM), Wideband Code Division Multiple Access (WCDMA), Code Division Multiple Access (CDMA), Worldwide Interoperability for Microwave Access (WiMAX) and Long Term Evolution (LTE) different from the first technology type.

17. A multi-stage crest factor reduction block, comprising:
a first individual crest factor reduction (CFR) block in a first CFR stage for processing one or more data samples associated with at least one channel of a first technology type and the one or more data samples associated with different channels of the at least one channel of the first technology type are aggregated prior to being applied to the first individual CFR block;
a second individual CFR block in said first CFR stage for processing one or more data samples associated with at least one channel of a second technology type, wherein the first technology type is different from the second technology type and the one or more data samples associated with different channels of the at least one channel of the second technology type are aggregated prior to being applied to the second individual CFR block;
a third individual CFR block in said first CFR stage for processing one or more data samples associated with one of a channel of the first technology type or a channel of the second technology type supplied directly to the third individual CFR block, wherein data samples associated with channels of the first technology type and data samples associated with channels of the second technology type are from signals communicated in accordance with different technology protocols;
a combiner for aggregating outputs of said first, second and third individual crest factor reduction blocks to generate an aggregated output of said first CFR stage; and
a composite crest factor reduction block in a second CFR stage for processing said aggregated output of said first CFR stage.

18. The multi-stage crest factor reduction block of claim 17, wherein said technology type comprises one or more of Global System for Mobile Communications (GSM), Wideband Code Division Multiple Access (WCDMA), Code Division Multiple Access (CDMA), Worldwide Interoperability for Microwave Access (WiMAX) and Long Term Evolution (LTE).

19. The multi-stage crest factor reduction block of claim 17, wherein said first and second individual crest factor reduction blocks are implemented using a sampling rate appropriate for said corresponding technology type.

20. The multi-stage crest factor reduction block of claim 17, wherein said composite crest factor reduction block operates at a higher sampling rate than said first and second individual crest factor reduction blocks.

21. The multi-stage crest factor reduction block of claim 17, wherein said one or more data samples are processed sample-by-sample or as a block of data samples.

* * * * *